United States Patent
Messervy et al.

(10) Patent No.: US 11,734,469 B2
(45) Date of Patent: Aug. 22, 2023

(54) SYSTEM AND METHOD FOR GENERATING A LANDSCAPE DESIGN

(71) Applicant: HOME OUTSIDE, INC, Bellows Falls, VT (US)

(72) Inventors: Julie Moir Messervy, Westminster, VT (US); David Rose, Brookline, MA (US); Kyle Scharpf, Bristol, CT (US)

(73) Assignee: HOME OUTSIDE, INC, Brattleboro, VT (US)

( * ) Notice: Subject to any disclaimer, the term of this patent is extended or adjusted under 35 U.S.C. 154(b) by 357 days.

(21) Appl. No.: 17/079,435

(22) Filed: Oct. 24, 2020

(65) Prior Publication Data

US 2021/0124850 A1   Apr. 29, 2021

Related U.S. Application Data

(60) Provisional application No. 62/925,743, filed on Oct. 24, 2019.

(51) Int. Cl.
*G06G 7/48* (2006.01)
*G06F 30/13* (2020.01)
(Continued)

(52) U.S. Cl.
CPC .............. *G06F 30/13* (2020.01); *G06F 30/12* (2020.01); *H04L 67/02* (2013.01)

(58) Field of Classification Search
CPC .... G06N 3/0454; G06N 3/0472; G06N 3/088; G06N 5/046; H04L 67/02; H04L 67/10; H04L 67/53; G06F 30/12; G06F 30/13
See application file for complete search history.

(56) References Cited

U.S. PATENT DOCUMENTS 9,262,853 B2 *   2/2016   Mitchell ................ G06T 11/60
2007/0011982 A1   1/2007   Swift
(Continued)

OTHER PUBLICATIONS

Kim, Hyun Ji, et al. "A Survey and Analysis on the Current Status of the Mobile Applications for Garden Design." 인간식물환경학회지 (JPPE) 22 (2019): 75-89.*
(Continued)

*Primary Examiner* — Rehana Perveen
*Assistant Examiner* — Nithya J. Moll
(74) *Attorney, Agent, or Firm* — AKC Patents, LLC; Aliki K. Collins

(57) ABSTRACT

A method for generating an online landscape design for a property includes first entering an address for a property and then importing satellite view data of the property and a street where the property is located from global mapping databases. Next, calculating property size, topography and house size from the satellite view data using a calculator engine. Next, performing scene segmentations and analyzing existing conditions via a landscape design engine, then applying custom vision classifiers for specific landscape elements via the landscape design engine, and then analyzing foliage conditions from the satellite view data. Next, determining property landscape improvements via a scoring engine and then determining materials lists, and calculating quantities, and costs for fulfilling the property landscape improvements via the calculator engine. Next, entering user preferences for the property landscape improvements via a user interface (UI) and then generating an improved landscape design for the property based on the user's preferences and the results of the scoring engine using the landscape design engine.

20 Claims, 18 Drawing Sheets

(51) Int. Cl.
  *H04L 67/02* (2022.01)
  *G06F 30/12* (2020.01)

(56) References Cited

U.S. PATENT DOCUMENTS

| | | | |
|---|---|---|---|
| 2007/0027660 A1* | 2/2007 | Swift | G09B 25/08 |
| | | | 703/1 |
| 2009/0216661 A1* | 8/2009 | Warner | G06Q 30/02 |
| | | | 705/26.1 |
| 2013/0179206 A1 | 7/2013 | Harper et al. | |
| 2014/0267393 A1* | 9/2014 | Mitchell | G06T 11/60 |
| | | | 345/632 |
| 2014/0280269 A1* | 9/2014 | Schultz | G06F 16/29 |
| | | | 707/758 |
| 2017/0178222 A1 | 6/2017 | High et al. | |
| 2017/0263034 A1* | 9/2017 | Kenoff | G06F 3/04842 |
| 2018/0039714 A1 | 2/2018 | High et al. | |

OTHER PUBLICATIONS

PCT/ISR; Jan. 7, 2021.
Lee, Landscape Research Record No. 7, Emerging Trends in Geospatial Technologies for Study of Urban Landscape, Dec. 31, 2018.

* cited by examiner

SYSTEM AND METHOD FOR GENERATING A LANDSCAPE DESIGN

CROSS REFERENCE TO RELATED CO-PENDING APPLICATIONS

This application claims the benefit of U.S. provisional application Ser. No. 62/925,743 filed on Oct. 24, 2019 and entitled "Patent for an Ai design service which is proactively generated, visualized and animated via 3D game engine technology, parametrically personalized, and funded as a service", which is commonly assigned and the contents of which are expressly incorporated herein by reference.

FIELD OF THE INVENTION

The present invention provides a system and a method for generating a landscape design for a given property, and more particularly to an online landscape design system that generates a landscape design for a property based on customer's preferences, a set of landscape design principles, property parameters and the site's environmental features.

BACKGROUND OF THE INVENTION

Typical landscape designs for a property include landscape components such as grasses, plants, flowers, bushes, trees, rocks, mulch, seashells, and yard decoration elements, among others. Landscape designs also include hardscapes, such as patios, walkways, pools, decks, furniture, outdoor kitchens, firepits, flag poles, gazebos, pergolas, arbors, flower boxes, gates, and fences, among others. Landscape designs may also include lighting elements, such as spot lights, flood lights, well lights, path lights, tree lights, lantern posts, and flag pole lights, among other.

There are many factors that need to be considered when generating a suitable landscape design for a given property. For example, for a given property location there are specific plants, grasses, flowers, bushes, and trees, that need to be selected depending upon the available water, sunlight, temperature, seasonal duration, and soil conditions. This is a daunting task for most property owners. In general, generating a visually coherent and robust landscape design and then selecting and positioning the landscape elements is a difficult task for most home owners.

Some home owners turn to professional landscapers to determine recommended landscape components to add and the location to add them to in order to enhance the look of their land and add value to their property. However, the majority of home owners are intimidated and overwhelmed by the vast selections, and can't afford the cost of hiring a professional landscape designer.

Accordingly, there is a need for an affordable landscape design system that generates a landscape plan for a property based on a customer's preferences and goals, location of the property and the site's environmental features.

SUMMARY OF THE INVENTION

The present invention provides a system and a method for programmatically generating a landscape design for a given property, and more particularly to an online landscape design system that generates a landscape design for a property based on customer's preferences, a set of landscape design principles, property parameters and the site's environmental features.

In general, in one aspect the invention provides a computer-implemented method for generating an online landscape design for a property includes the following steps. First, entering an address for a property and then importing satellite view data of the property and a street where the property is located from global mapping databases. Next, calculating property size, topography and house size from the satellite view data using a calculator engine. Next, performing scene segmentations and analyzing existing conditions via a landscape design engine, then applying custom vision classifiers for specific landscape elements via the landscape design engine, and then analyzing foliage conditions from the satellite view data. Next, determining property landscape improvements via a scoring engine and then determining materials lists, and calculating quantities, and costs for fulfilling the property landscape improvements via the calculator engine. Next, entering user preferences for the property landscape improvements via a user interface (UI) and then generating an improved landscape design for the property based on the user's preferences and the results of the scoring engine using the landscape design engine.

Implementations of this aspect of the invention include the following. The scoring engine determines the property landscape improvements by importing and comparing the property's existing landscape design with training data of high scoring landscapes, and rules-based design principles. The method further includes displaying 3D-animated views of the improved landscape design to the user via the UI. The determining of materials lists, and the calculating quantities, and costs for fulfilling the property landscape improvements includes importing real-time pricing data for landscape elements, calculating material quantities for the improved landscape design and calculating overall project cost. The method further includes importing home value data for the property from third party databases and estimating an increase in the property's home value after the implementation of the improved landscape design and calculating a return on investment (ROI) using the calculator engine. The UI comprises fields for entering user preferences for privacy settings, style, and budget. The UI further comprises fields for viewing the 3D-animated views of the improved landscape design at different times of the day, different seasons and future years. The user interface is presented to the user via a mobile communication device, a desktop computer, a laptop computer, or other communication devices that are configured to connect to cloud services via a network. The method further includes providing online landscape designer consultation and online contractor recommendations based on location proximity and reviews. The scoring engine determines a property landscape score based on parameters including metrics about carbon sequestration, native plants that pollinate for bees, insects, and birds, trees that bring shade in appropriate locations, screens for creating privacy, paths that lead to various decision points, gathering places that enable social interactions with friends and family, use of local materials, pervious pavement materials, driveway logistics, easy intuitive paths to access points of the house, free and clear of overhead structures, trees, or plant material that increases the risk of fire or destruction, surrounding landscapes, ratio of planting beds to grass, pools of space, clear space distinctions, and exterior dining elements close to a kitchen, among others. The scoring engine utilizes a combination of algorithmic techniques, including Rules Based Design, Generative Adversarial Network, Variational Auto Encoder, and Conditional Auto Encoder algorithms and techniques.

In general, in another aspect the invention provides a system for generating an online landscape design for a property including a client software, a server-based application, and a database datastore. The client software is configured to run on a client computing device and the server-based application and database datastore are configured to be hosted and run on a cloud service computing environment and the client software accesses the server-based application and the database datastore via a network connection. The database datastore includes global mapping databases, home value databases, databases with training data of high scoring landscapes, and rules-based design principles, and landscape element pricing databases. The server-based application includes computer implemented instructions for entering an address for a property, importing satellite view data of the property and a street where the property is located from the global mapping databases, calculating property size, topography and house size from the satellite view data using a calculator engine, performing scene segmentations and analyzing existing conditions via a landscape design engine, applying custom vision classifiers for specific landscape elements via the landscape design engine, analyzing foliage conditions from the satellite view data, determining property landscape improvements via a scoring engine, determining materials lists, and calculating quantities, and costs for fulfilling the property landscape improvements via the calculator engine, entering user preferences for the property landscape improvements, and generating an improved landscape design for the property based on the user's preferences and the results of the scoring engine using the landscape design engine. The client software comprises a user interface (UI) that receives user inputs and displays landscape designs for the property. The client software is human-consumable via a web browser, or a desktop application, or a mobile application, or machine-consumable via a process connected to an application programming interface (API). The network connection may be hypertext markup language (HTML), simple object access protocol (SOAP) or representation state transfer (REST) on top of transmission control protocol (TCP) or user data protocol (UDP). The scoring engine determines the property landscape improvements by importing and comparing the property's existing landscape design with training data of high scoring landscapes, and rules-based design principles. The determining of materials lists, and the calculating quantities, and costs for fulfilling the property landscape improvements comprises importing real-time pricing data for landscape elements, calculating material quantities for the improved landscape design and calculating overall project cost. The UI includes fields for entering user preferences for privacy settings, style, and budget. The UI also includes fields for viewing the 3D-animated views of the improved landscape design at different times of the day, different seasons and future years. The scoring engine utilizes a combination of algorithmic techniques, including Rules Based Design, Generative Adversarial Network, Variational Auto Encoder, and Conditional Auto Encoder algorithms and techniques.

BRIEF DESCRIPTION OF THE DRAWINGS

Some embodiments of the present invention are illustrated as an example and are not limited by the figures of the accompanying drawings, in which like references may indicate similar elements and in which.

DETAILED DESCRIPTION OF THE INVENTION

The present invention provides a system and a method for programmatically generating a landscape design for a given property, and more particularly to an online landscape design system that generates a landscape design for a property based on customer's preferences, a set of landscape design principles, property parameters and the site's environmental features.

Figure 1:
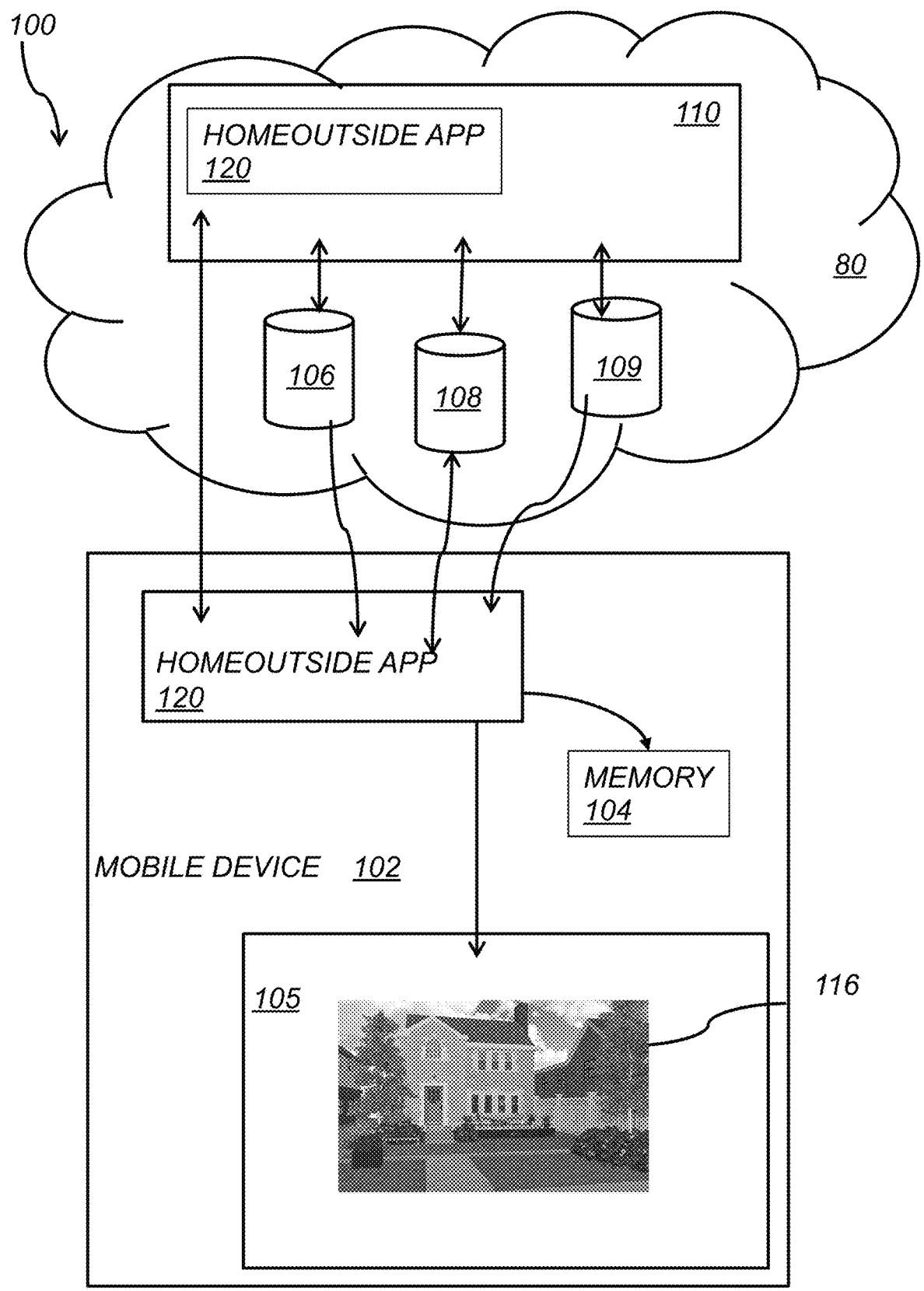
FIG. 1 depicts an overview diagram of the landscape design generating system, according to this invention.

Referring to FIG. 1, a landscape design generating system 100 according to this invention includes a computing device 102 and a landscape design generating application (HOME-OUTSIDE APP) 120. In this example, the computing device is a mobile communication device 102 that includes a display 105, memory 104 and a copy of the video generating application 120 stored in memory 104. The mobile communication device 102 connects via a network connection 80 to a server 110 and downloads the landscape design generating application 120. The mobile communication device 102 also connects to an online data storage device 106, third party servers 108 and a global mapping server 109. In one example, the mobile communication device 102 is a mobile phone (e.g., iPhone™), server 110 is a server for the Apple Store™, the online data storage device 106 is Dropbox™, a third party server 108 is an Amazon™ server and the global mapping server 109 is a Google™ maps server. A landscape design 116 generated with the landscape design generating system 100 is viewed via a display 105 of the mobile communication device 102 or via a display in a separate device (not shown). In other examples, the computing device is a tablet, a mobile phone, a laptop computer, or any other computing device that is configured to connect to a server via a network connection. In other embodiments, the landscape design application 120 is stored on the server 110 and is accessed directly via the network connection without downloading a copy on the computing device 102.

Figure 2:
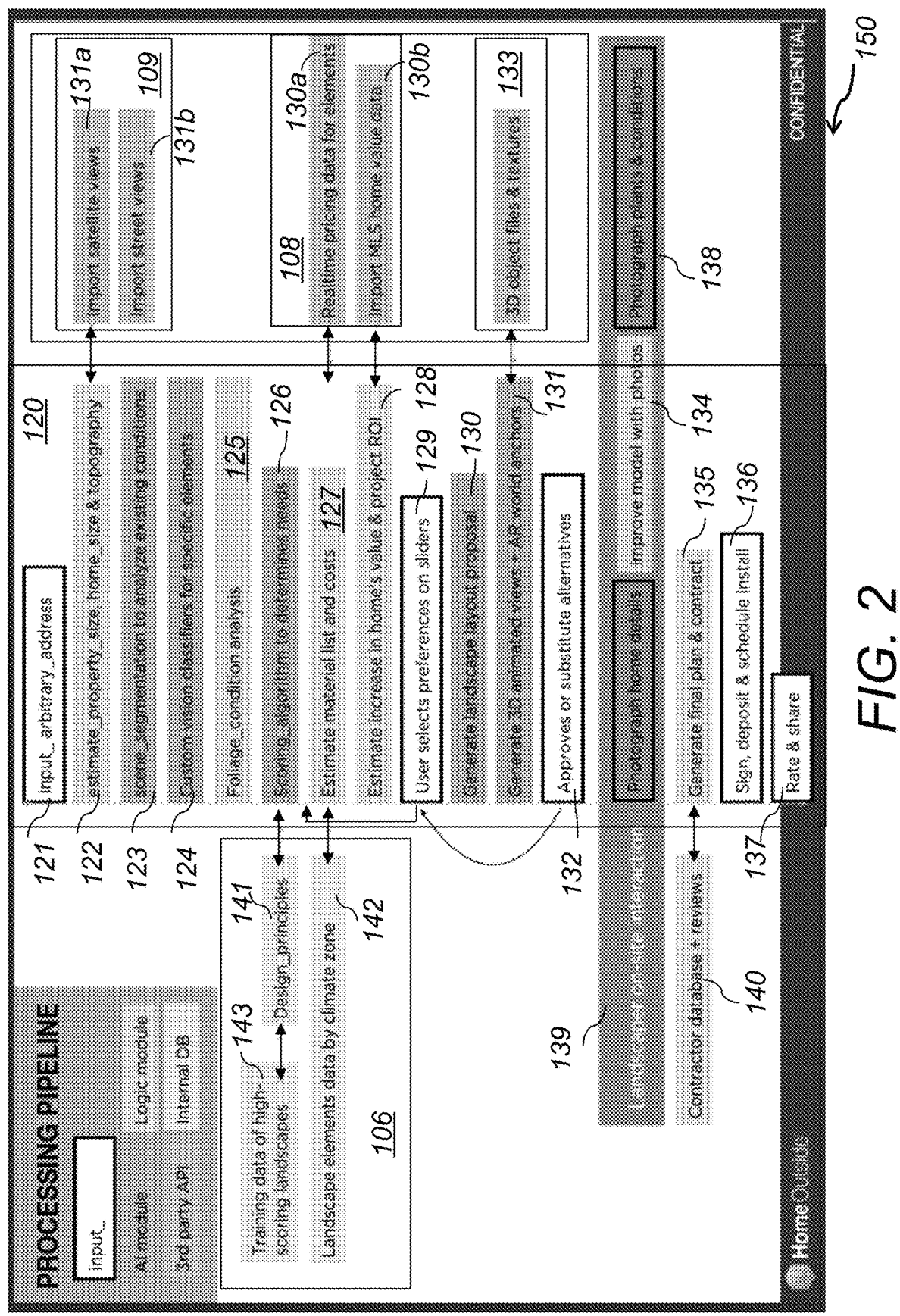
FIG. 2 depicts a block diagram of the process for generating a landscape design, according to this invention.
Figure 4A:
FIG. 4A depicts a google maps image of a street where a property is located for which a landscape design is to be generated.
Figure 4B:
FIG. 4B depicts a 3D-image of the property for which a landscape design is to be generated.

Referring to FIG. 2, a process for generating a landscape design 150 with the landscape design generating system 100 according to this invention includes the following steps. First, a user logs into the landscape design application 120 and enters a property address (121). The system imports satellite views of the street 131a where the property is located and focuses on the specific property indicated by the property address 131b, as shown in FIG. 4A and FIG. 4B. The satellite data 131a, 131b are imported from a global mapping server 109. The design application logic module calculates an estimate of the property size, home size and the specific topography (122). Next, the design application artificial intelligence (AI) engine performs scene segmentations to analyze the existing conditions (123) and provides custom vision classifiers for specific elements (124). Next, the design application logic module analyses the location specific foliage conditions (125). Next, the design application scoring module retrieves landscape data from the online internal database 106 and determines the landscape needs for the specific property (126). The landscape data that are retrieved from the internal database 106 include training data of high scoring landscapes 143, rules-based design principles 141 and landscape elements data by climate zone 142. Next, the landscape design application logic module calculates an estimate for the list of the required materials and their cost (127) based on real time pricing data for the various landscape elements and then calculates an estimate of the increase in the value of the property and the project return on investment (ROI) based on imported home value data (128). The real time pricing data for the landscape elements 130a and the home value data 130b are imported from a third party server 108. In one example, third party server 108 for the landscape elements 130a is Amazon, Home Depot, Lowe's or Wayfair, among others. In one example, third party server 108 for the home value data 130b is the Multiple Listing Service (MLS) server or a Zillow server, or a Redfin server. Next, the user enters their preferences (129) and the landscape design application generates a landscape layout proposal (130) and presents a before and after 3D animated image of the property to the user (131) using 3D object files and textures 133. The user's preferences may be entered prior to the material cost estimations step 127. Next, the user approves or substitutes alternatives to the landscape layout proposal (132). At this stage the user has the option to consult with an on-site landscaper 139, provide a photograph with the home details, and improve the model with photos (134). Photograph of plants and conditions are imported from an online database 138. Next, the final plan is generated and a contract is presented for the execution of the plan (135). The contract may be provided by a contractor selected from an online database that also includes reviews of the contractors 140. The user then signs the contract, makes a deposit and schedules the installation (136). Finally, the user may rate the service and share the results online (137).

Figure 3:
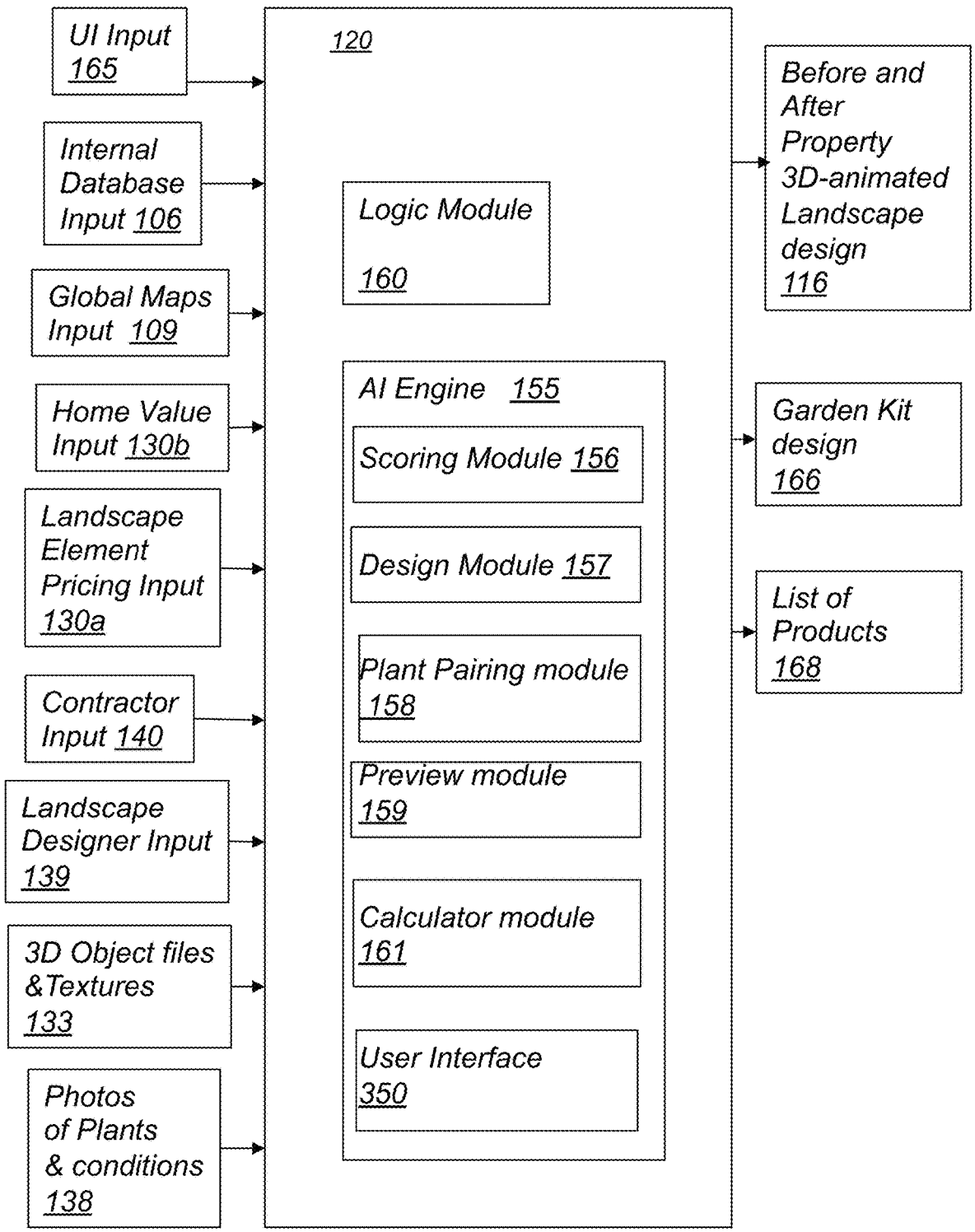
FIG. 3 depicts a block diagram of the computing architecture for the landscape generating application.

Referring to FIG. 3, the landscape design application 120 includes a logic module 160 and an AI engine 155 that includes a scoring module 156, a design module 157, a plant pairing module 158, a preview module 159, a calculator module 161 and a user interface 350. The inputs of the landscape design application 120 include a user input 165, internal database input 106, global maps input 109, home value input 130b, landscape element pricing input 130a, contractor input 140, landscape designer input 139, 3D object files and textures 133 and photos of plants and conditions 138. The outputs of the landscape design application 120 include before and after property 3D-animated landscape designs 116, garden kit designs 166 and a list of products 168.

In the step of calculating an estimate of the property size, home size and the specific topography (122) by the design application logic module 160, the following additional parameters are also calculated including home facing direction, existing conditions, design impediments, fencing, furniture, home style and location, car style, condition of the roof, shading conditions, material properties, plant identities, existing trees and bushes, among others.

Figure 7A:
FIG. 7A depicts an image of a property that is analyzed with the scoring module, according to this invention.
Figure 7B:
FIG. 7B depicts the scoring result for the property of FIG. 7A.
Figure 7C:
FIG. 7C depicts the calculated increase in property value and the amount of the sequestered carbon for the property of FIG. 7A.
Figure 8:
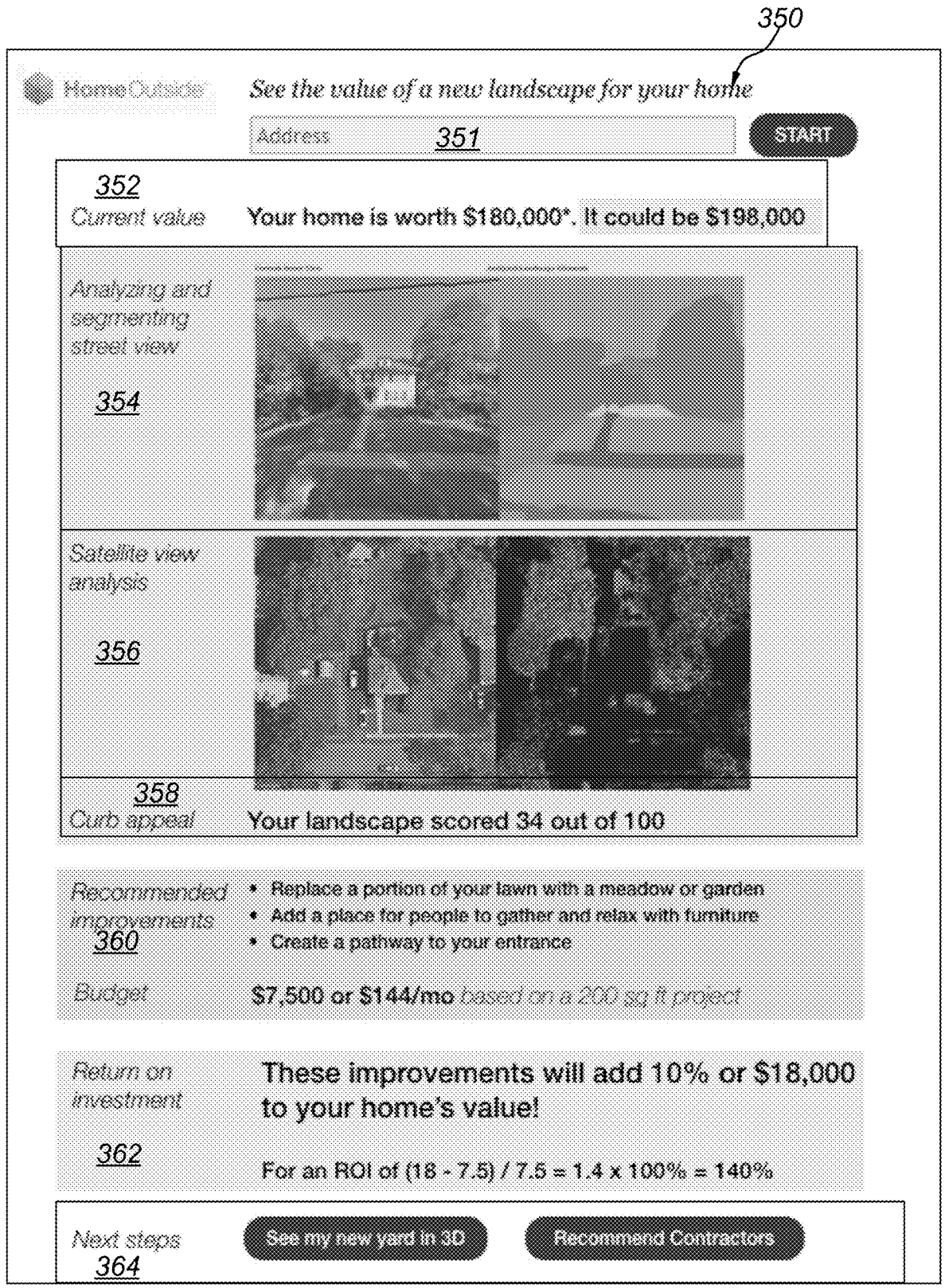
FIG. 8 depicts the user interface of the scoring module.

In the step of calculating the property score by the scoring module 156, the score is based on parameters affecting the value of the property including metrics about carbon sequestration, native plants that pollinate for bees, butterflies, insects, and birds, trees that bring shade in appropriate locations, screens for creating privacy, paths that lead to various decision points, gathering places that enable social interactions with friends and family, use of local materials, pervious pavement materials, driveway logistics, easy intuitive paths to access points of the house, free and clear of overhead structures, trees, or plant material that increases the risk of fire or destruction, surrounding landscapes, ratio of planting beds to grass, pools of space, clear space distinctions, and exterior dining elements close to a kitchen, among others. The landscape score is used to determine the urgency of design intervention. In the example of FIG. 7A the property 80 is analyzed and the scoring algorithm 156 determines that the property needs shade trees 84, a gathering zone 82, and that the driveway is too massive 86. A score of 12 is given, as shown in FIG. 7B. Implementation of the suggested improvements would result in a 15% increase in home value and 130 lbs of carbon will be sequestered, as shown in FIG. 7C. The scoring result and a summary of the recommended improvements is presented via the user interface 350, shown in FIG. 8. The scoring UI 350 displays the home address 351, the current home value and the projected increase in home value after the implementation of the landscape design plan 352, the step of analyzing and segmenting the street view 354, the step of analyzing the satellite view 356, the curb appeal score 358, the recommended improvements and the estimated budget 360, the calculated return on investment 362 and the next steps 364. The next steps 364 include viewing the 3D-animated image of the property with the new landscape plan, and recommended contractors.

Figure 5A:
FIG. 5A depicts a 3D-image of the landscape design that was generated with the system of FIG. 1 for the property of FIG. 4B.
Figure 5B:
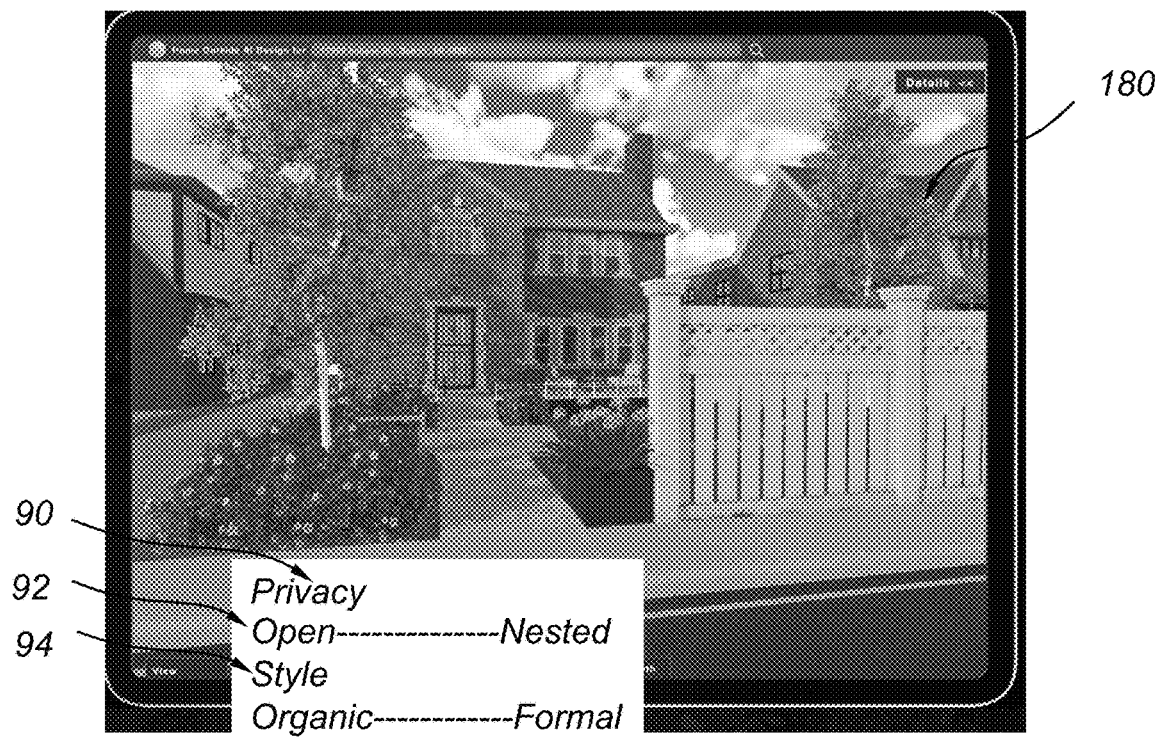
FIG. 5B depicts customization of the 3D-image of the landscape design of FIG. 5A.
Figure 5C:
FIG. 5C depicts the 3D-image of the landscape design of FIG. 5A in the morning time of the day.
Figure 5D:
FIG. 5D depicts the 3D-image of the landscape design of FIG. 5A in the evening time of the day.

As was mentioned above, the landscape design module 157 and scoring module 156 utilize rules-based design principles and create a landscape design that uses well-established landscape design rules in an automated computer application to fulfill the customer's needs based on their initial input. In the step of entering the user's preferences 129, the user views the 3D-animated image of the suggested landscape design 180 and has the options to make refinements using the slider buttons 90 or view the property with the new design at different times of the day, different seasons and after a 5-year growth of the plantings 95, as shown in FIG. 5A. The refine sliders 90 include parameters such as privacy level 92, style 94, use of space, and budget, among others, as shown in FIG. 5B. The style 94 may be varied from organic to formal and the privacy level 92 may be varied from open to nested. In one example, increasing the privacy level 92 to a more nested setting introduces a fence and more bushes and plantings in the front of the house, as shown in FIG. 5B. FIG. 5C depicts the landscape design at a morning setting 95 and FIG. 5D depicts the landscape design at a late afternoon setting 96. There is an increased shade 97 at the front door of the house from the tree in front of the entrance during the afternoon hours, as shown in FIG. 5D. The system also provides night view of the design in order to facilitate and promote the selection and procurement of landscaping lighting components. The system allows the user to choose parametric tradeoffs including choosing between night safety versus light intrusion, sustainability versus homogeneous plantings, inexpensive versus robust materials, among others.

Figure 6:
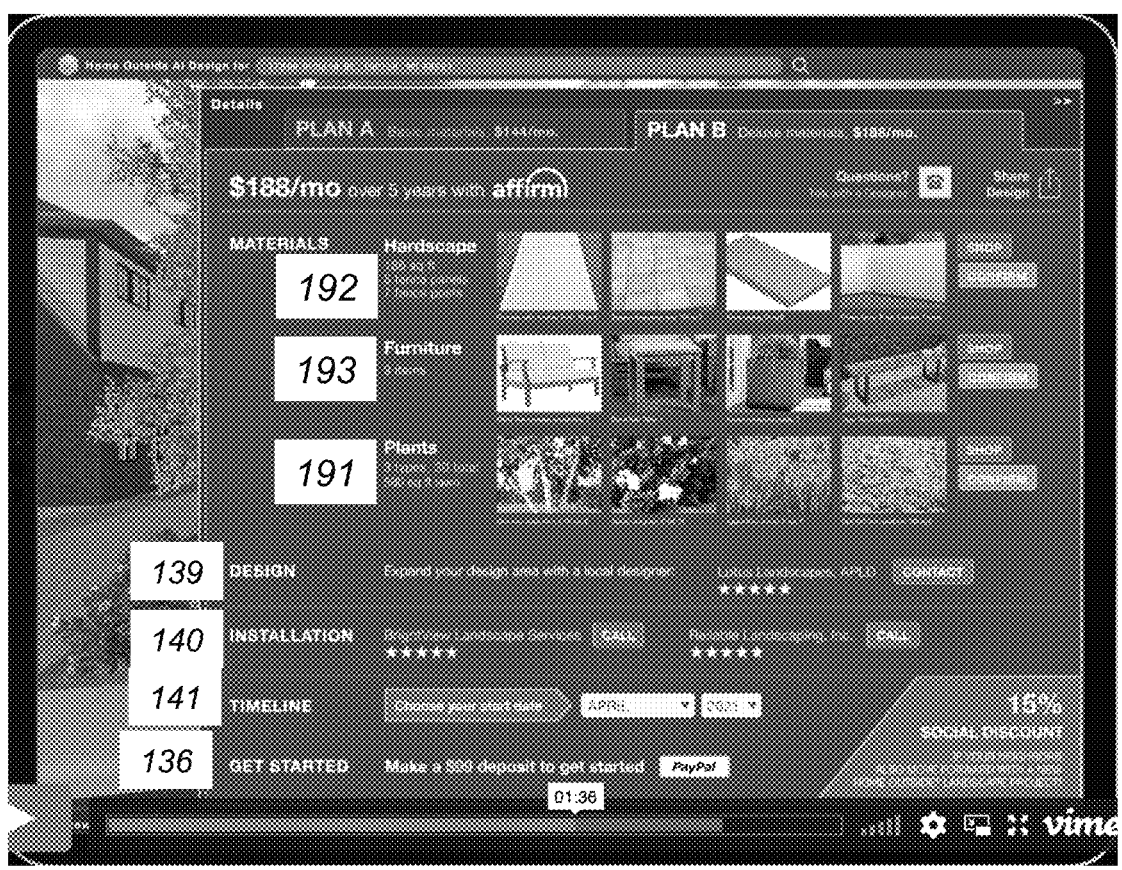
FIG. 6 depicts two different plans for the implementation of the landscape design of FIG. 5A.

Referring to FIG. 6, the landscape design application provides different plan options A and B 190 based on the user's preferences and then it outputs a list of landscape elements including lists of plants, bushes, and trees 191, hardscapes 192, furniture 193, and lighting for procurement and installation. In this example, plan A utilizes basic materials and plan B utilizes deluxe materials. The cost of each plan is indicated and the user has the options to choose plan A or plan B. The user also has the option to choose a landscape designer 139, a landscape installation company 140, the timeline for the project 141, and can provide payment through the application 136.

Once the design is approved, the system protects and keeps track of the processes of credit approval and financing, algorithmically recommends installers based on project features, availability, proximity, and ratings, coordinates communications between customer and installer, ensures sourcing of materials is maintained and prohibits shortcuts or work arounds, verifies delivery of materials and installation through visual means and provides photos during and after installation.

The landscape design module 157 and scoring module 156 utilize a combination of algorithmic techniques, which may include Rules-Based Design, Generative Adversarial Network, Variational Auto Encoder, and Conditional Auto Encoder algorithms and techniques, among others. The AI engine 155 learns what makes an "Optimized" design and iteratively refines the solution space based on a proprietary scoring system.

The landscape design AI engine 155 provides neighborhood normalization by learning the "accepted" style of a specific community or area so the final output is conditioned.

The landscape design AI engine 155 utilizes contextual big data collection methods for future in-depth analytics. Examples of such data include social neighborhood, high population of children, swing sets, concentration of specific generations, inferred programs, large parties, pool parties, predominance of vehicle types, and adornment trends, among others.

Figure 9A:
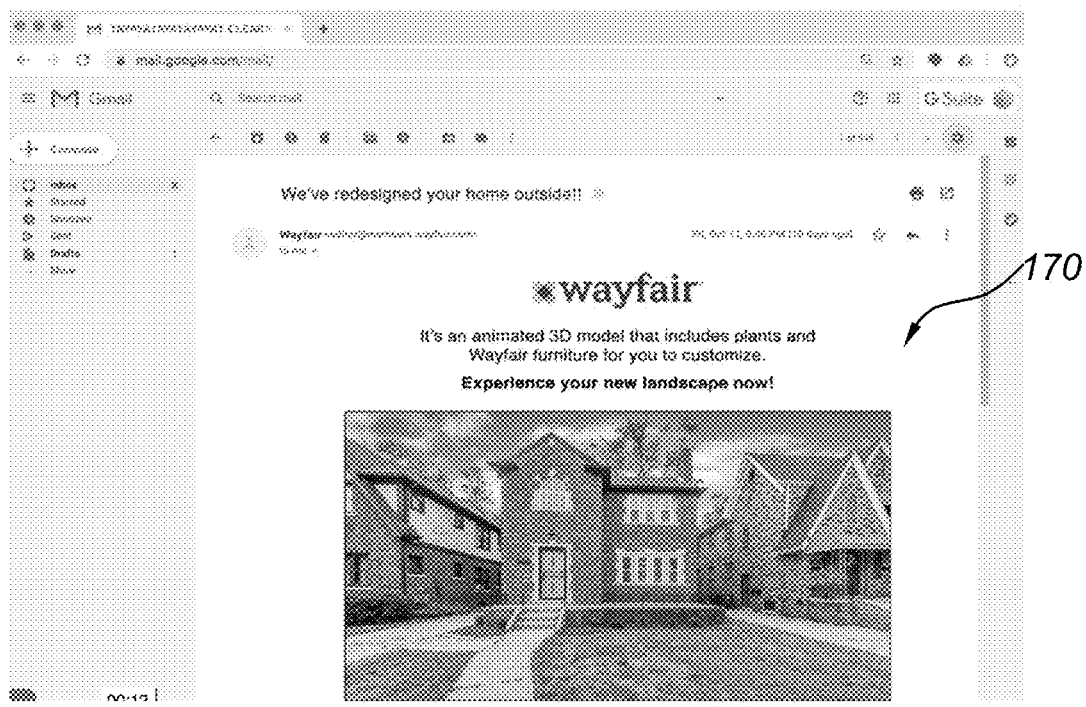
FIG. 9A depicts an e-mail message with a 3D-image of a property for which a landscape design is to be generated.
Figure 9B:
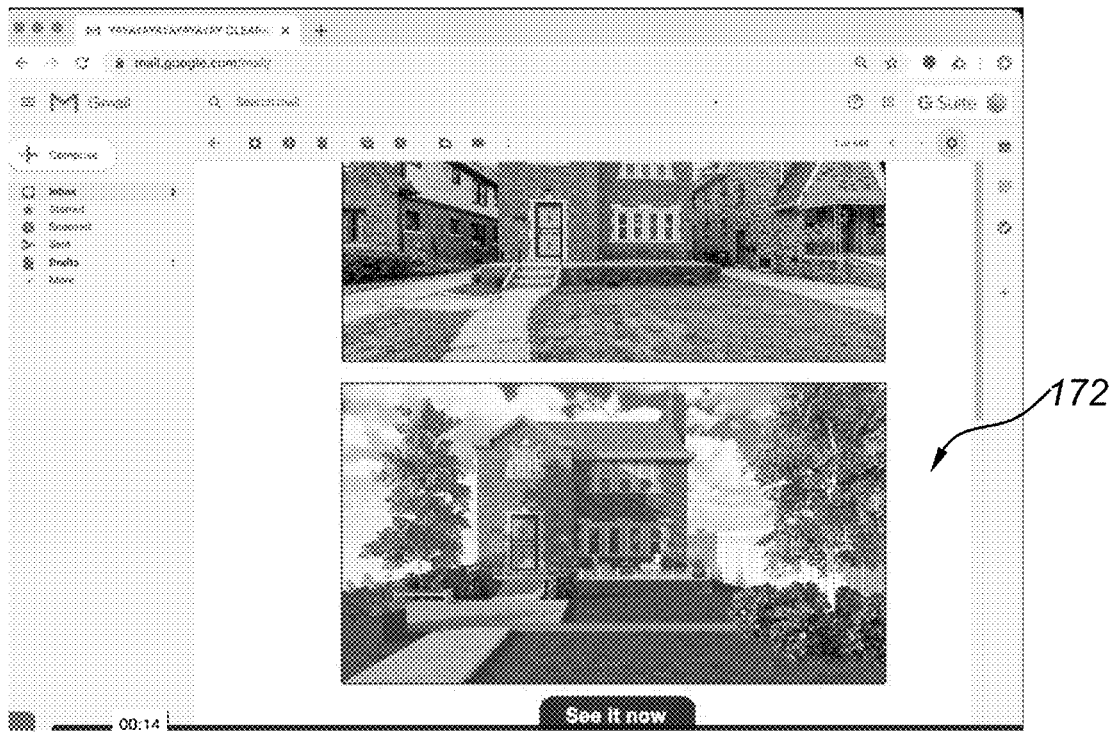
FIG. 9B depicts an e-mail message with a 3D-image of the landscape design that was generated for the property of FIG. 9A.

The landscape design AI application 120 can be used by individuals as a landscape visualization tool as well as companies and websites to promote their products or services that populate the landscape. In the examples of FIG. 9A and FIG. 9B, a website service provided by Wayfair sends an e-mail to a customer with the message "We have redesigned your home outside" 170. The customer has the option to click on the "see it now" button which will then present an image of the customer's house before and after the redesign 172. The customer then has the option to purchase the landscape elements and furnishings from Wayfair and other affiliated suppliers.

The outputs of the design application 120 include a list of landscape elements including lists of plants, bushes, trees 191, hardscapes 192, furniture 193, and lighting for procurement and installation. The application recommends installers and contractors based on proximity and reviews. The application also provides risk calculations for procurement for availability of product and viability of installation and automatically provides alternatives or substitutions. The application also provides monitoring of plants and structures in need of service or replacement and provides recommendations for future investments by utilizing internet connected cameras installed on the home or embedded in wearables. Since, the survivability of a landscape design depends upon proper irrigation, the system is configured to provide installation of a cloud connected soaker hose or other irrigation systems to increase the vitality of the designed landscapes. The initial training data for the system originate from internal sources. In future models, the system will build other stylistic models for landscapes based on other sources of machine learning training data including Japanese garden, cottage, French colonial, native, meadow, other iconic landscape styles, among others.

Figure 10:
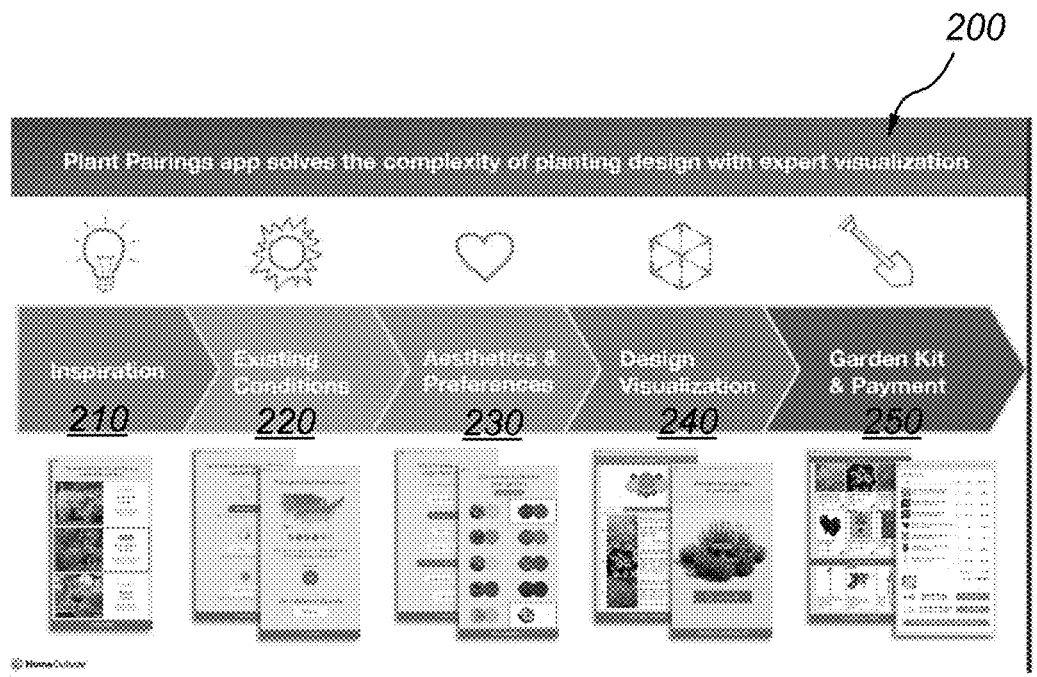
FIG. 10 depicts the process flow diagram of the plant pairing application, according to this invention.
Figure 11:
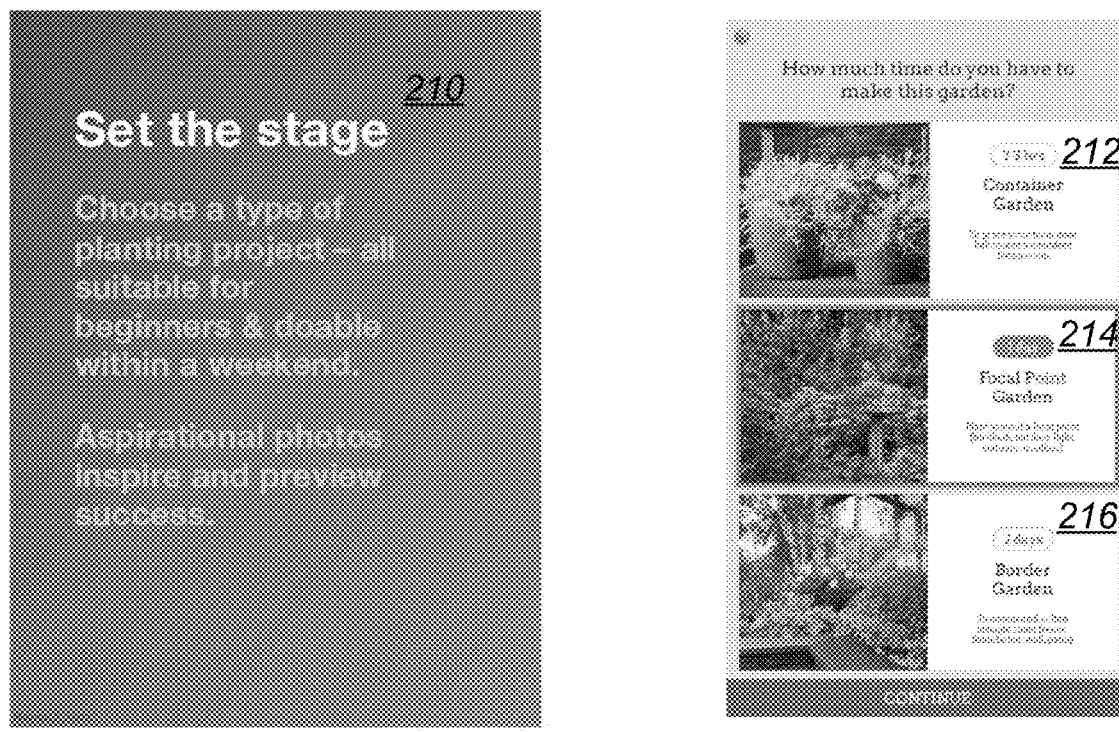
FIG. 11 depicts the inspiration step of the plant pairing application of FIG. 10.
Figure 12:
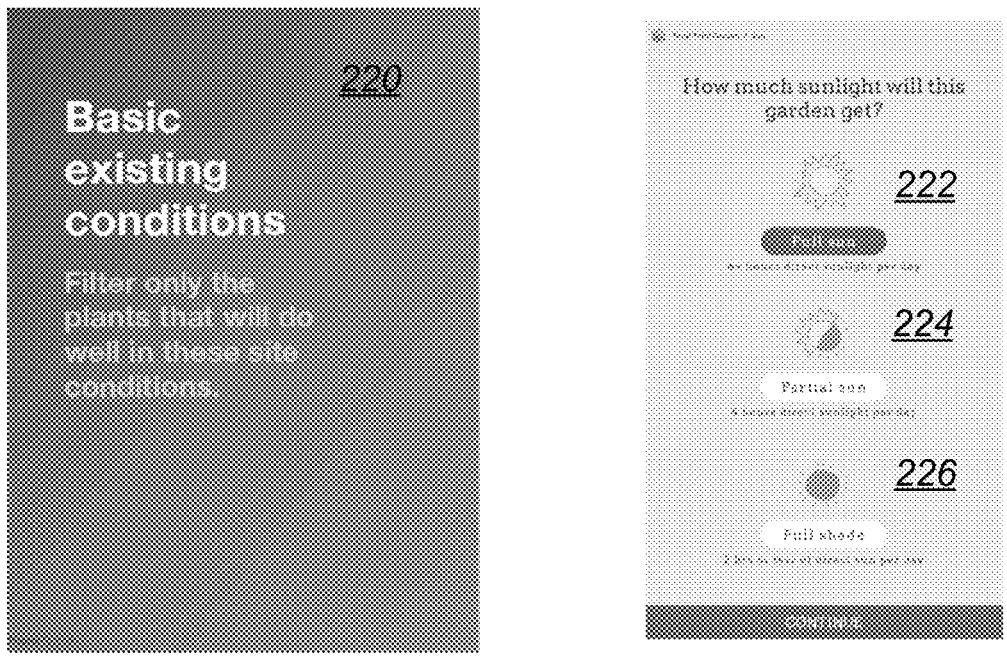
FIG. 12 depicts the site conditions selection step of the plant pairing application of FIG. 10.
Figure 13:
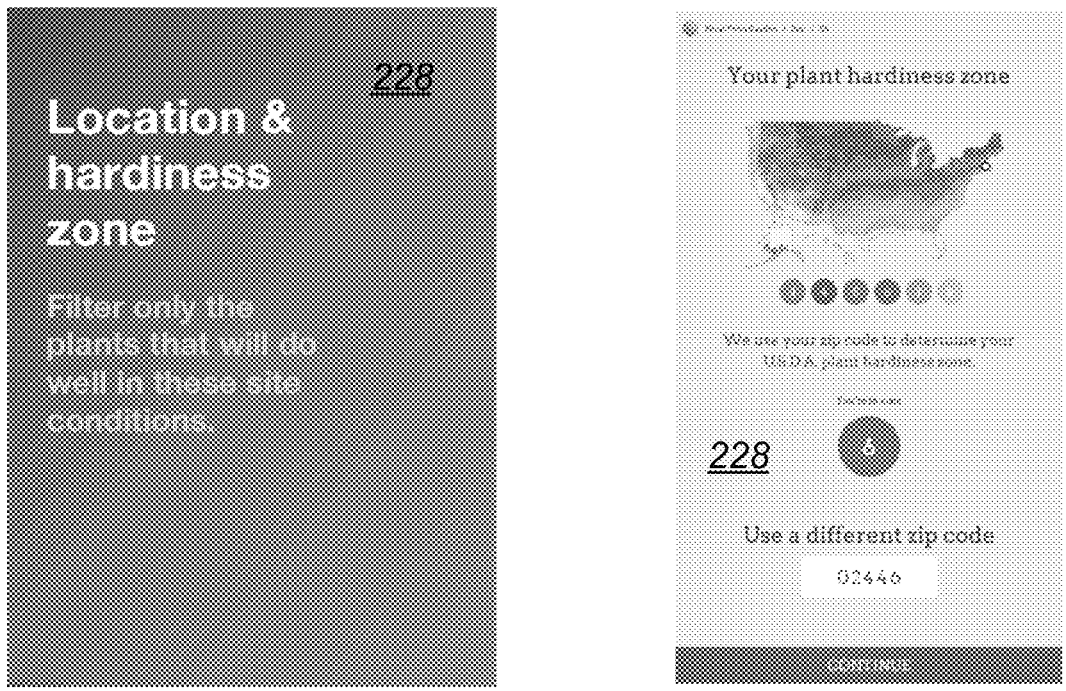
FIG. 13 depicts the hardiness zone selection step of the plant pairing application of FIG. 10.

Referring to FIG. 10, the plant pairing module 158 is used to generate and visualize garden planting designs. The plant pairing module 158 implements a plant pairing process 200 that includes an inspiration step 210, an existing conditions step 220, aesthetics and preferences step 230, a design visualization step 240 and a garden kit step 250. Referring to FIG. 11, the inspiration step 210 presents to the user the options to select a garden project based upon the time they have available for the project and provides aspirational photos to inspire and preview success. In one example, inspiration step 210 presents to a user the options to create a container garden 212, or a focal point garden 214 or a border garden 216. The container garden is estimated to take 2-3 hours, the focal point garden 1 day and the border garden 2 days. Referring to FIG. 12, the existing conditions step 220 includes selecting the site conditions from one of the options of full sun 222, or partial sun 224 or full shade 226 and then selecting the plant hardiness zone, shown in FIG. 13. The module will then filter the plants that will do well based on the selected site conditions and the selected hardiness zone.

Figure 14:
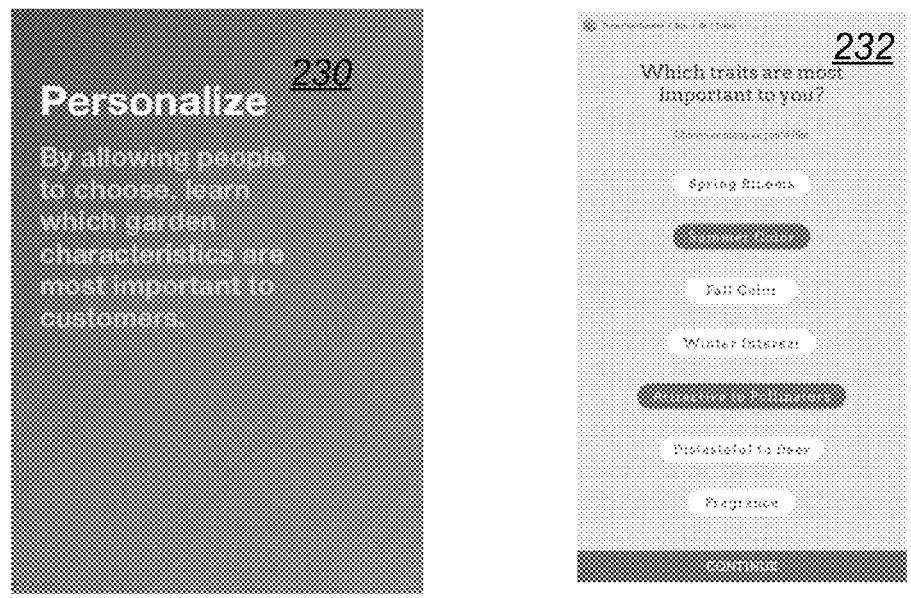
FIG. 14 depicts the personalization step of the plant pairing application of FIG. 10.
Figure 15:
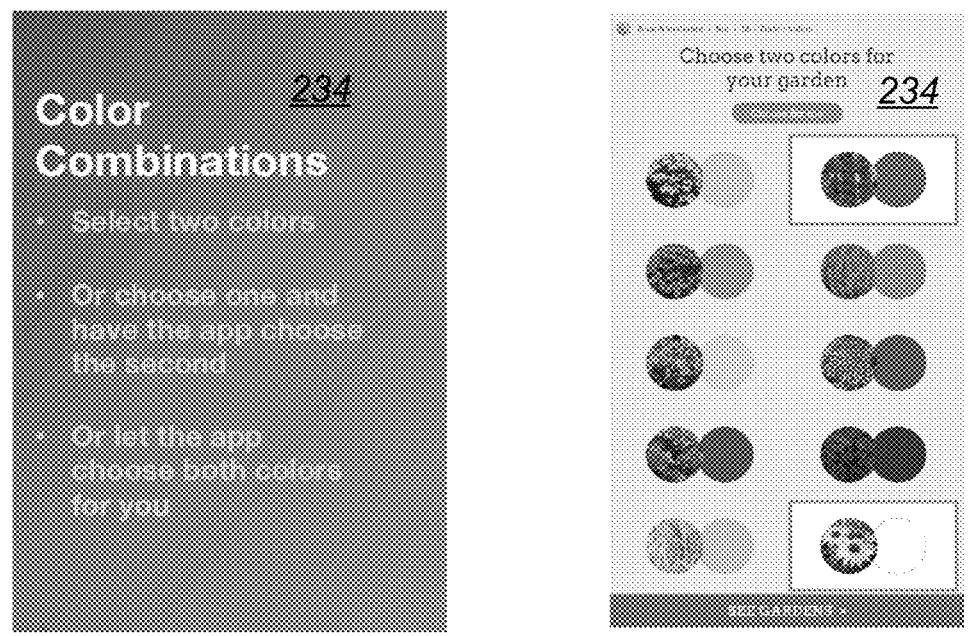
FIG. 15 depicts the color selection step of the plant pairing application of FIG. 10.
Figure 16:
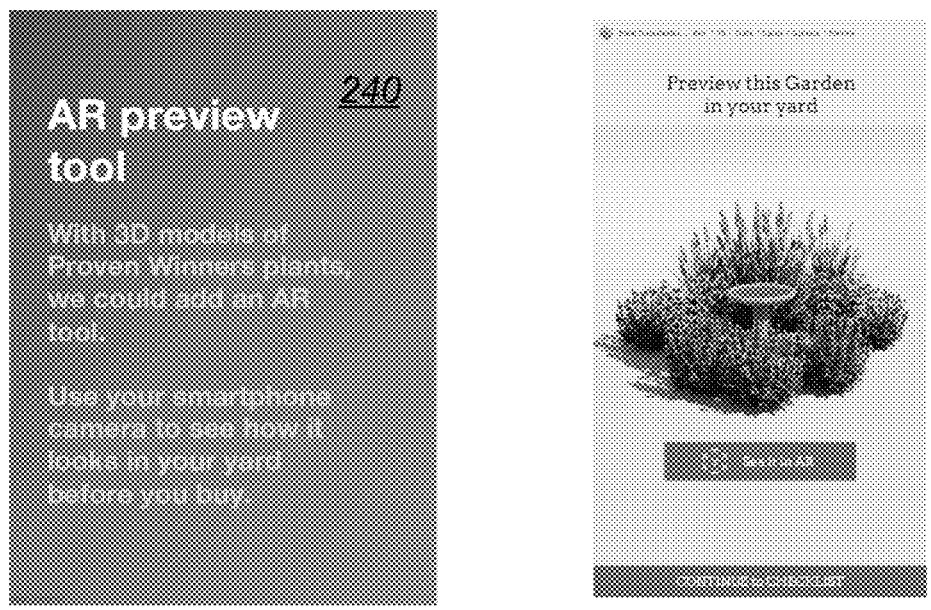
FIG. 16 depicts the AR visualization step of the plant pairing application of FIG. 10.
Figure 17:
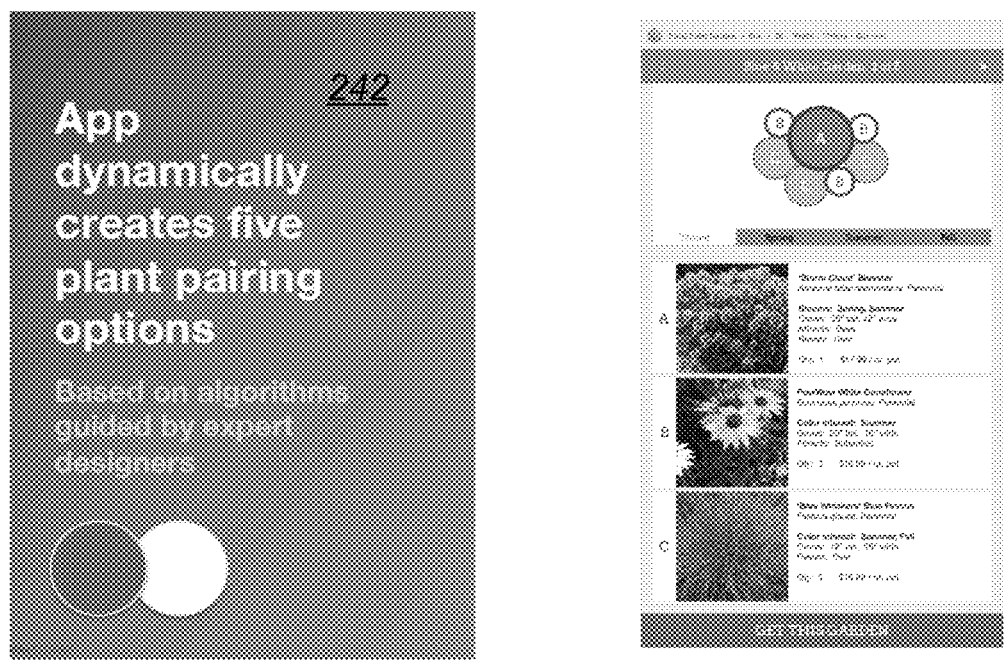
FIG. 17 depicts the plant pairing step of the plant pairing application of FIG. 10.
Figure 18:
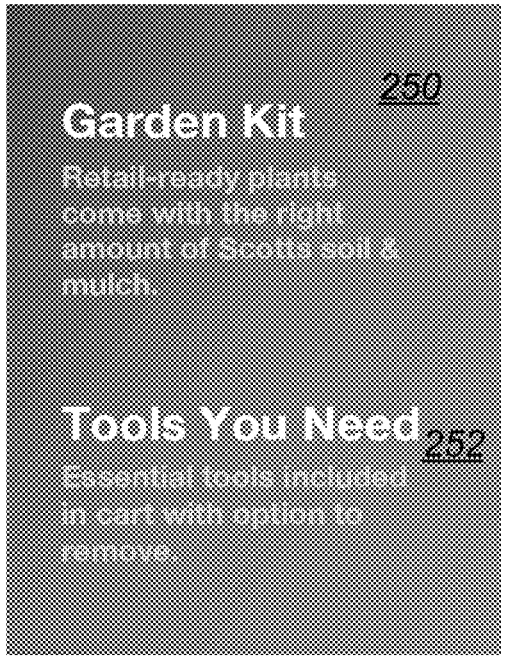
FIG. 18 depicts the garden kit design step of the plant pairing application of FIG. 10.
Figure 18:
Figure 19:
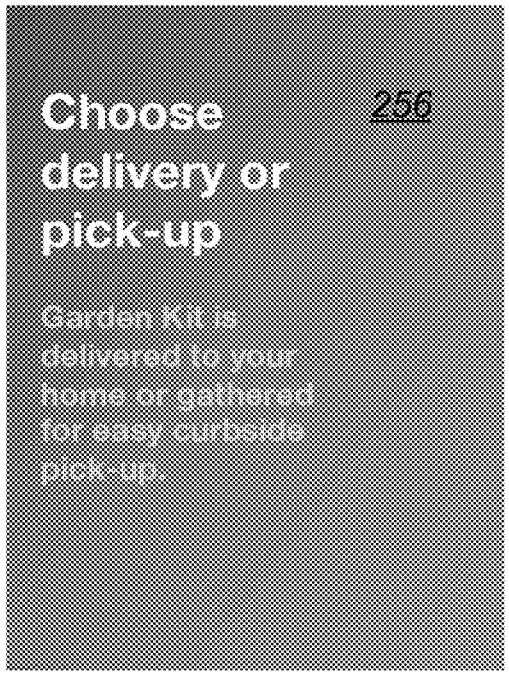
FIG. 19 depicts the payment step for the garden kit of FIG. 18 of the plant pairing application of FIG. 10.
Figure 19:
Figure 20:
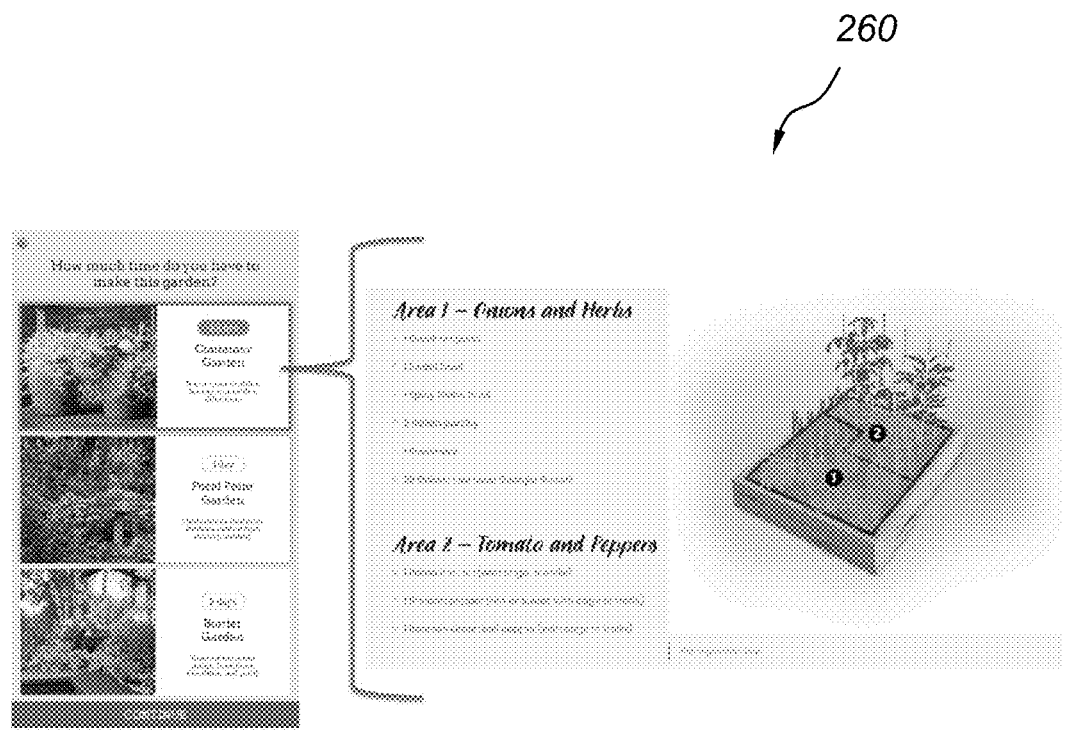
FIG. 20 depicts a vegetable garden container kit designed with the plant pairing application of FIG. 10.
Figure 21:
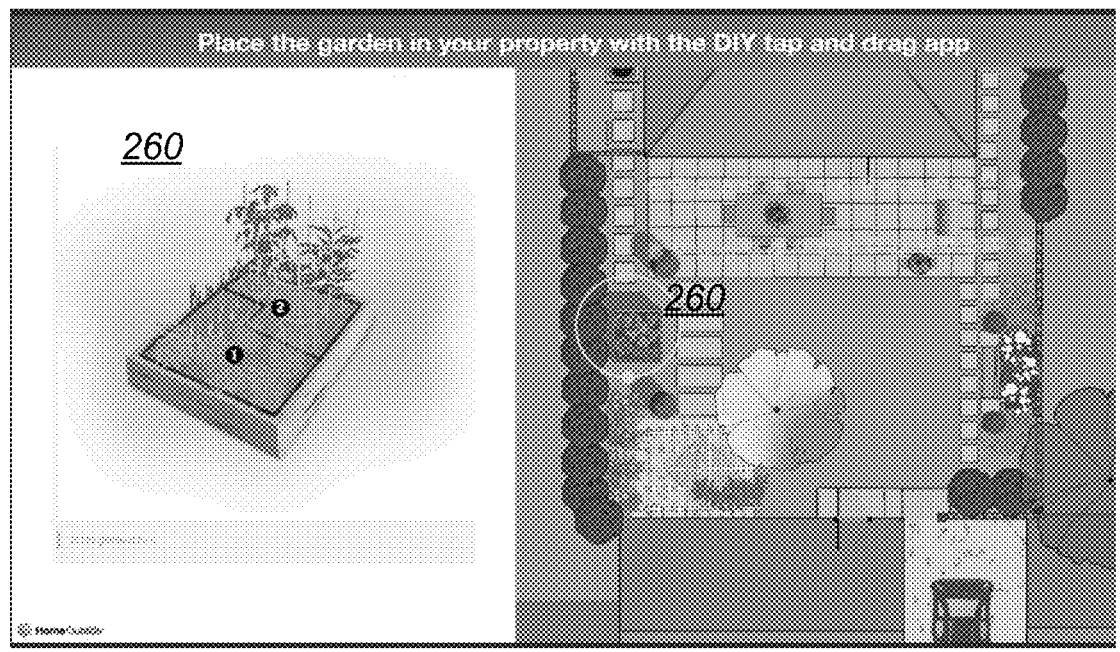
FIG. 21 depicts placing the vegetable garden kit in the 2D-generated landscape design for the property of FIG. 5A.

Next, the user enters their personal aesthetic preferences 230 in terms of bloom types, color type season, fragrance, deer resistant and pollinator attractiveness, as shown in FIG. 14. Next, the user selects two primary colors for the garden 234, as shown in FIG. 15. Next, the module utilizes an artificial reality (AR) tool to visualize the selected garden options 240, as shown in FIG. 16 and then the module dynamically creates five plant pairings based on algorithms guided by expert designers 242, shown in FIG. 17. Next, a garden kit 250 is generated that includes retail-ready plants 254 with the right amount of soil and mulch and the tools needed to install the plants 252, shown in FIG. 18. Finally, the delivery or pick-up of the selected merchandise is chosen 256 and then the customer places the order and submits payment for the order 258, shown in FIG. 19. In one example, the generated garden kit is a vegetable garden container 260, shown in FIG. 20 and the visualized garden container 260 is moved in the visualized property design until the right location is selected, as shown in FIG. 21.

Figure 22:
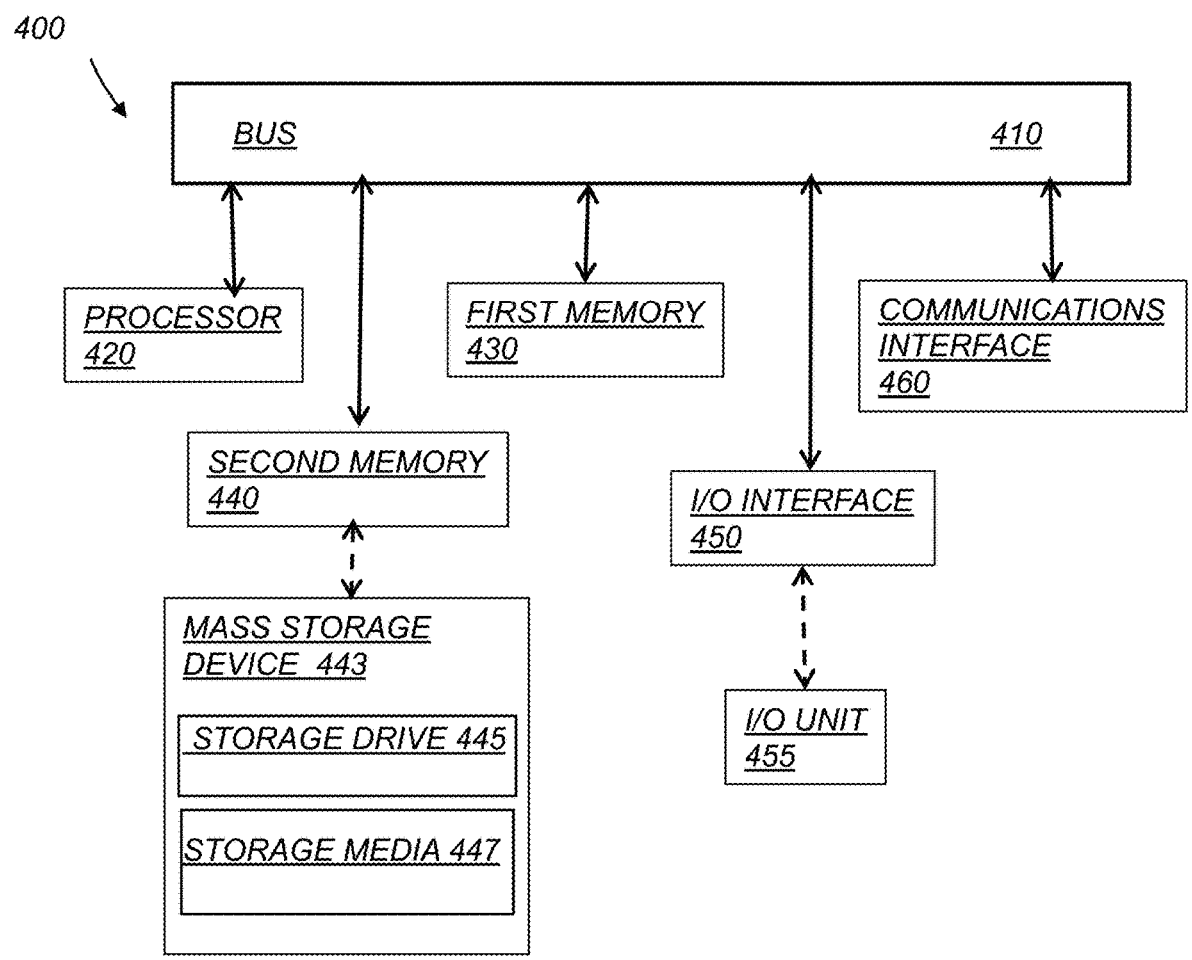
FIG. 22 depicts a schematic diagram of a computing system used in the implementation of this invention.

Referring to FIG. 22, an exemplary computer system 400 associated with the mobile communication device or network architecture that may be used to implement the system of the present invention includes at least a processor 420, first memory 430, second memory 440, I/O interface 450 and communications interface 460. All these computer components are connected via a bus 410. One or more processors 420 may be used. Processor 420 may be a special-purpose or a general-purpose processor. As shown in FIG. 10, bus 410 connects the processor 420 to various other components of the computer system 400. Bus 410 may also connect processor 420 to other components (not shown) such as, sensors, and servomechanisms. Bus 410 may also connect the processor 420 to other computer systems. Processor 420 can receive computer code via the bus 410. The term "computer code" includes applications, programs, instructions, signals, and/or data, among others. Processor 420 executes the computer code and may further send the computer code via the bus 410 to other computer systems. One or more computer systems 400 may be used to carry out the computer executable instructions of this invention.

Computer system 400 may further include one or more memories, such as first memory 430 and second memory 440. First memory 430, second memory 440, or a combination thereof function as a computer usable storage medium to store and/or access computer code. The first memory 430 and second memory 440 may be random access memory (RAM), read-only memory (ROM), a mass storage device, or any combination thereof. As shown in FIG. 10, one embodiment of second memory 440 is a mass storage device 443. The mass storage device 443 includes storage drive 445 and storage media 447. Storage media 447 may or may not be removable from the storage drive 445. Mass storage devices 443 with storage media 447 that are removable, otherwise referred to as removable storage media, allow computer code to be transferred to and/or from the computer system 400. Mass storage device 443 may be a Compact Disc Read-Only Memory ("CDROM"), ZIP storage device, tape storage device, magnetic storage device, optical storage device, Micro-Electro-Mechanical Systems ("MEMS"), nanotechnological storage device, floppy storage device, hard disk device, USB drive, among others. Mass storage device 443 may also be program cartridges and cartridge interfaces, removable memory chips (such as an EPROM, or PROM) and associated sockets.

The computer system 400 may further include other means for computer code to be loaded into or removed from the computer system 400, such as the input/output ("I/O") interface 450 and/or communications interface 460. Both the I/O interface 450 and the communications interface 460 allow computer code to be transferred between the computer system 400 and external devices including other computer systems. This transfer may be bi-directional or omni-direction to or from the computer system 400. Computer code transferred by the I/O interface 450 and the communications interface 460 are typically in the form of signals, which may be electronic, electromagnetic, optical, or other signals capable of being sent and/or received by the interfaces. These signals may be transmitted via a variety of modes including wire or cable, fiber optics, a phone line, a cellular phone link, infrared ("IR"), and radio frequency ("RF") link, among others.

The I/O interface 450 may be any connection, wired or wireless, that allows the transfer of computer code. In one example, I/O interface 450 includes an analog or digital audio connection, digital video interface ("DVI"), video graphics adapter ("VGA"), musical instrument digital interface ("MIDI"), parallel connection, PS/2 connection, serial connection, universal serial bus connection ("USB"), IEEE1394 connection, PCMCIA slot and card, among others. In certain embodiments the I/O interface connects to an I/O unit 455 such as a user interface, monitor, speaker, printer, touch screen display, among others. Communications interface 460 may also be used to transfer computer code to computer system 400. Communication interfaces include a modem, network interface (such as an Ethernet card), wired or wireless systems (such as Wi-Fi, Bluetooth, and IR), local area networks, wide area networks, and intranets, among others.

The invention is also directed to computer products, otherwise referred to as computer program products, to provide software that includes computer code to the computer system 400. Processor 420 executes the computer code in order to implement the methods of the present invention. In one example, the methods according to the present invention may be implemented using software that includes the computer code that is loaded into the computer system 400 using a memory 430, 440 such as the mass storage drive 443, or through an I/O interface 450, communications interface 460, or any other interface with the computer system 400. The computer code in conjunction with the computer system 400 may perform any one of, or any combination of, the steps of any of the methods presented herein. The methods according to the present invention may be also performed automatically, or may be invoked by some form of manual intervention. The computer system 400, or network architecture, of FIG. 10 is provided only for purposes of illustration, such that the present invention is not limited to this specific embodiment.

Several embodiments of the present invention have been described. Nevertheless, it will be understood that various modifications may be made without departing from the spirit and scope of the invention. Accordingly, other embodiments are within the scope of the following claims.

What is claimed is:

1. A computer-implemented method for generating an online landscape design for a property comprising:
   providing a computing system comprising at least a memory storing computer-executable instructions of a landscaping application, and a processor coupled to the memory and wherein said landscaping application comprises a calculator engine, a landscape design engine, and a scoring engine;
   providing a user interface (UI);
   entering an address for a property via the UI;

importing satellite view data of the property and a street where the property is located from global mapping databases;

calculating property size, topography and house size from the satellite view data using the calculator engine;

performing scene segmentations and analyzing existing conditions of the property via the landscape design engine;

applying vision classifiers for specific landscape elements of the property via the landscape design engine;

analyzing location specific foliage conditions from the satellite view data;

calculating a landscape score of the property by retrieving landscape data from online databases and comparing an existing landscape design of the property to the retrieved landscape data via the scoring engine;

determining property landscape improvements by the scoring engine;

determining materials lists, and calculating quantities, and costs for fulfilling the property landscape improvements via the calculator engine;

entering user preferences for the property landscape improvements via the user interface (UI);

generating an improved landscape design for the property based on the user's preferences and the property landscape improvements of the scoring engine using the landscape design engine;

calculating an improved landscape score of the improved design via the scoring engine and displaying a 3D-image of the property with the improved landscape design and the improved score.

2. The method of claim 1, wherein the scoring engine determines the property landscape improvements by importing and comparing the property's existing landscape design with training data of high scoring landscapes, and rules-based design principles.

3. The method of claim 1, further comprising displaying 3D-animated views of the improved landscape design to the user via the UI.

4. The method of claim 1, wherein the determining of materials lists, and the calculating quantities, and costs for fulfilling the property landscape improvements comprises importing real-time pricing data for landscape elements, calculating material quantities for the improved landscape design and calculating overall project cost.

5. The method of claim 1, further comprising importing home value data for the property from third party databases and estimating an increase in the property's home value after the implementation of the improved landscape design and calculating a return on investment (ROI) using the calculator engine.

6. The method of claim 1, wherein the UT comprises fields for entering user preferences for privacy settings, style, and budget.

7. The method of claim 1, wherein the UI comprises fields for viewing 3D-animated views of the improved landscape design at different times of the day, different seasons and future years.

8. The method of claim 1, wherein the user interface is presented to the user via a mobile communication device, a desktop computer, a laptop computer, or other communication devices that are configured to connect to cloud services via a network.

9. The method of claim 1, further comprising providing online landscape designer consultation.

10. The method of claim 1, further comprising providing online contractor recommendations based on location proximity and reviews.

11. The method of claim 1, wherein the scoring engine determines a property landscape score based on parameters comprising metrics about carbon sequestration, native plants that pollinate for bees, insects, and birds, trees that bring shade in appropriate locations, screens for creating privacy, paths that lead to various decision points, gathering places that enable social interactions with friends and family, use of local materials, pervious pavement materials, driveway logistics, easy intuitive paths to access points of the house, free and clear of overhead structures, trees, or plant material that increases the risk of fire or destruction, surrounding landscapes, ratio of planting beds to grass, pools of space, clear space distinctions, and exterior dining elements close to a kitchen.

12. The method of claim 1, wherein the scoring engine utilizes a combination of algorithmic techniques, including one or more of Rules Based Design, Generative Adversarial Network, Variational Auto Encoder, and Conditional Auto Encoder algorithms and techniques.

13. A system for generating an online landscape design for a property comprising:
a computing system comprising at least a memory storing computer-executable instructions of a landscaping application, and a processor coupled to the memory and wherein said landscaping application comprises a calculator engine, a landscape design engine, and a scoring engine;
a user interface (UI) comprising a field for entering an address for a property;
wherein the landscaping application comprises computer implemented instructions for entering an address for a property, importing satellite view data of the property and a street where the property is located from the global mapping databases, calculating property size, topography and house size from the satellite view data using the calculator engine, performing scene segmentations and analyzing existing conditions of the property via the landscape design engine, applying vision classifiers for specific landscape elements of the property via the landscape design engine, analyzing location specific foliage conditions from the satellite view data, calculating a landscape score of the property by retrieving landscape data from online databases and comparing an existing landscape design of the property to the retrieved landscape data via the scoring engine, determining property landscape improvements by the scoring engine, determining materials lists, and calculating quantities, and costs for fulfilling the property landscape improvements via the calculator engine, entering user preferences for the property landscape improvements via the UI, and generating an improved landscape design for the property based on the user's preferences and the property landscape improvements of the scoring engine using the landscape design engine, and calculating an improved landscape score of the improved design via the scoring engine and displaying a 3D-image of the property with the improved landscape design and the improved score.

14. The system of claim 13, wherein the landscaping application is human-consumable via a web browser, or a desktop application, or a mobile application, or machine-consumable via a process connected to an application programming interface (API).

15. The system of claim 13, wherein the landscape application is configured to run on a client computing device and/or a server configured to be hosted on a cloud service computing environment and wherein the client computing device accesses the server and online databases via a network connection and wherein the network connection comprises one of hypertext markup language (HTML), simple object access protocol (SOAP) or representation state transfer (REST) on top of transmission control protocol (TCP) or user data protocol (UDP).

16. The system of claim 13, wherein the scoring engine determines the property landscape improvements by importing and comparing the property's existing landscape design with training data of high scoring landscapes, and rules-based design principles.

17. The system of claim 13, wherein the determining of materials lists, and the calculating quantities, and costs for fulfilling the property landscape improvements comprises importing real-time pricing data for landscape elements, calculating material quantities for the improved landscape design and calculating overall project cost.

18. The system of claim 13, wherein the UI comprises fields for entering user preferences for privacy settings, style, and budget.

19. The system of claim 13, wherein the UI comprises fields for viewing 3D-animated views of the improved landscape design at different times of the day, different seasons, and future years.

20. The system of claim 13, wherein the scoring engine utilizes a combination of algorithmic techniques, including one or more of Rules Based Design, Generative Adversarial Network, Variational Auto Encoder, and Conditional Auto Encoder algorithms and techniques.

* * * * *